United States Patent
Hughes et al.

(10) Patent No.: US 9,837,939 B1
(45) Date of Patent: Dec. 5, 2017

(54) SYSTEM AND METHOD FOR PROVIDING VIBRATION ISOLATION BY MAGNETIC LEVITATION

(71) Applicant: LOCKHEED MARTIN CORPORATION, Bethesda, MD (US)

(72) Inventors: John G. Hughes, Casselberry, FL (US); Thomas E. Higgins, Oviedo, FL (US); Lloyd Daniel Griffin, Jr., Orlando, FL (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 181 days.

(21) Appl. No.: 14/676,224

(22) Filed: Apr. 1, 2015

(51) Int. Cl.
| | |
|---|---|
| *H02K 7/09* | (2006.01) |
| *H02N 15/00* | (2006.01) |
| *H01F 7/06* | (2006.01) |
| *H01F 7/20* | (2006.01) |
| *G03F 7/20* | (2006.01) |

(52) U.S. Cl.
CPC ............. *H02N 15/00* (2013.01); *H01F 7/064* (2013.01); *H01F 7/206* (2013.01); *G03F 7/70758* (2013.01); *H02K 7/09* (2013.01); *H02K 2201/18* (2013.01)

(58) Field of Classification Search
USPC ...................... 361/139, 144; 310/12.05, 90.5
See application file for complete search history.

(56) References Cited

U.S. PATENT DOCUMENTS

| | | | |
|---|---|---|---|
| 4,795,123 A | 1/1989 | Forward et al. | |
| 4,803,413 A | 2/1989 | Kendig et al. | |
| 4,848,525 A | 7/1989 | Jacot et al. | |
| 4,849,666 A | 7/1989 | Hoag | |
| 5,156,370 A | 10/1992 | Silcox et al. | |
| 5,170,104 A | 12/1992 | Laughlin | |
| 5,196,745 A | 3/1993 | Trumper | |
| 5,213,047 A * | 5/1993 | Fujiwara | B60L 13/10 104/281 |
| 5,222,437 A * | 6/1993 | Shibata | B60L 13/10 104/282 |
| 5,231,336 A | 7/1993 | van Namen | |
| 5,294,854 A | 3/1994 | Trumper | |
| 5,385,217 A | 1/1995 | Watanabe et al. | |
| 5,990,587 A | 11/1999 | Shimanovich et al. | |
| 6,036,162 A | 3/2000 | Hayashi | |
| 6,266,142 B1 * | 7/2001 | Junkins | G01S 5/163 250/559.14 |
| 6,378,672 B1 | 4/2002 | Wukui | |
| 6,588,554 B2 | 7/2003 | Fujita et al. | |
| 6,707,230 B2 | 3/2004 | Smith et al. | |
| 6,872,961 B2 | 3/2005 | Jacques et al. | |
| 6,942,202 B2 | 9/2005 | Kienholz | |
| 6,974,006 B2 | 12/2005 | Ruckman et al. | |
| 6,987,335 B2 | 1/2006 | Korenaga | |
| 7,164,463 B2 | 1/2007 | Galburt et al. | |
| 7,383,929 B2 | 6/2008 | Korenaga | |
| 7,728,462 B2 | 6/2010 | Williams et al. | |
| 7,765,905 B2 | 8/2010 | Trumper et al. | |
| 8,393,902 B2 * | 3/2013 | VanBiervliet | G09B 9/12 434/28 |

* cited by examiner

*Primary Examiner* — Danny Nguyen
(74) *Attorney, Agent, or Firm* — Terry M. Sanks, Esquire; Beusse Wolter Sanks & Maire, PLLC

(57) ABSTRACT

A magnetic levitation system comprising a control system configured to control six degrees of freedom of a levitated object, wherein each degree of freedom has at least a third order roll off. Another system and a method are also disclosed.

21 Claims, 11 Drawing Sheets

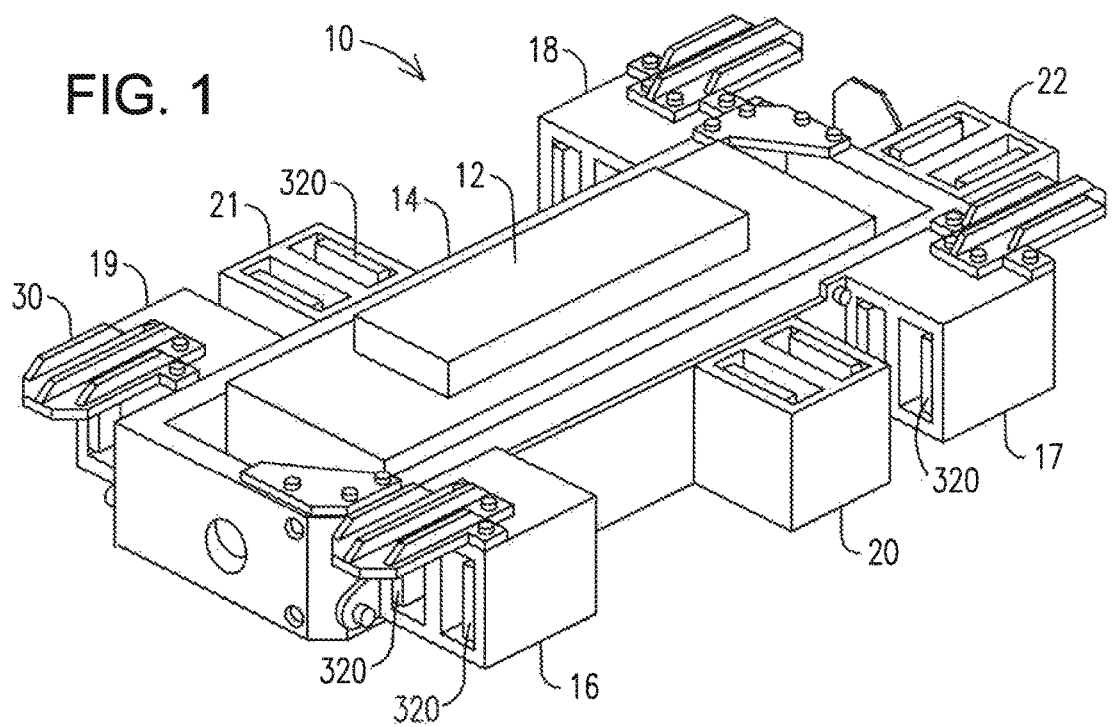
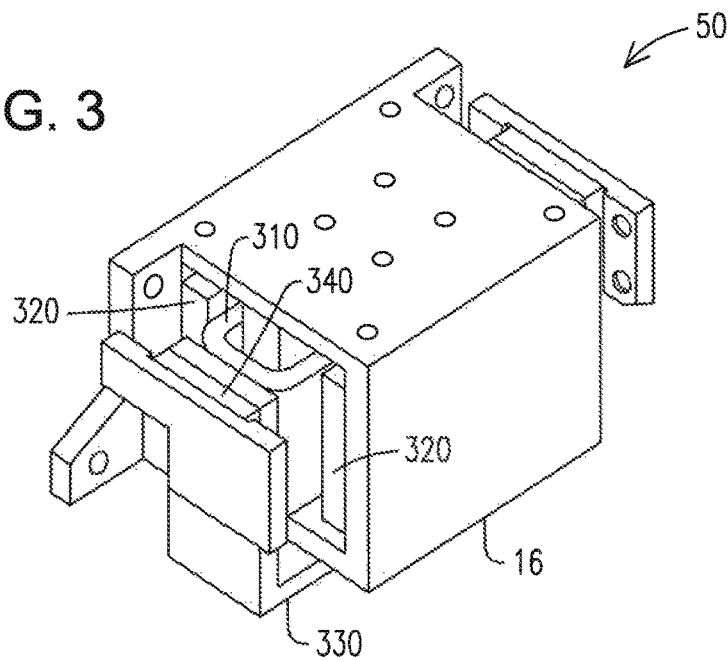

SYSTEM AND METHOD FOR PROVIDING VIBRATION ISOLATION BY MAGNETIC LEVITATION

BACKGROUND

Embodiments relate to magnetic levitation and, more particularly, to providing vibration isolation with magnetic levitation.

Magnetic levitation involves suspending an object with no support other than magnetic fields. Magnetic force is used to counteract the effects of the gravitational and any other accelerations. One issue involved in magnetic levitation is providing an upward force, or lift, sufficient to counteract gravity. Another issue is stability, more specifically insuring that the system does not spontaneously slide or flip into a configuration where the lift is either diminished causing the levitated item to fall or sharply increased causing it to stick. This is often referred to as the refrigerator magnet problem.

Magnetic levitation traditionally operates on the principal of magnetic attraction and as such is statically unstable in all six degrees of freedom, lift (or levitation), pitch, roll, yaw, lateral displacement and longitudinal displacement. Due to such instability, levitation must be controlled in levitation height, pitch, roll, lateral displacement, yaw and longitudinal displacement. Existing levitated systems are extremely sensitive to the smallest irregularities and thus difficult to provide stable control for an object that is levitated.

Manufactures of such levitation systems and users would benefit from being able to magnetically levitate an object where environmental effects are isolated to provide for vibration isolation of the object levitated.

SUMMARY

Embodiments relate to a system and a method for using magnetic levitation to provide for vibration isolation. The system comprises a control system configured to control six degrees of freedom of a levitated object. Each degree of freedom has at least a third order roll off.

Another system comprises a magnetic levitation subsystem, and an assembly configured to levitate using the magnetic levitation in six degrees of freedom. The system also comprises at least one sensor configured to determine displacement of the assembly during levitation in each degree of freedom and a controller configured to stabilize the assembly to at least a third order roll off for each degree of freedom.

The method comprises magnetically levitating an object with at least one actuator and controlling six degrees of freedom of the object with each degree of freedom having at least a third order roll off while levitated with a controller.

BRIEF DESCRIPTION OF THE DRAWINGS

A more particular description briefly stated above will be rendered by reference to specific embodiments thereof that are illustrated in the appended drawings. Understanding that these drawings depict only typical embodiments and are not therefore to be considered to be limiting of its scope, the embodiments will be described and explained with additional specificity and detail through the use of the accompanying drawings in which:

FIG. 1 shows an embodiment of an inner translated assembly of a system;

FIG. 3 shows an embodiment of the linear force assembly;

DETAILED DESCRIPTION

Figure 2:
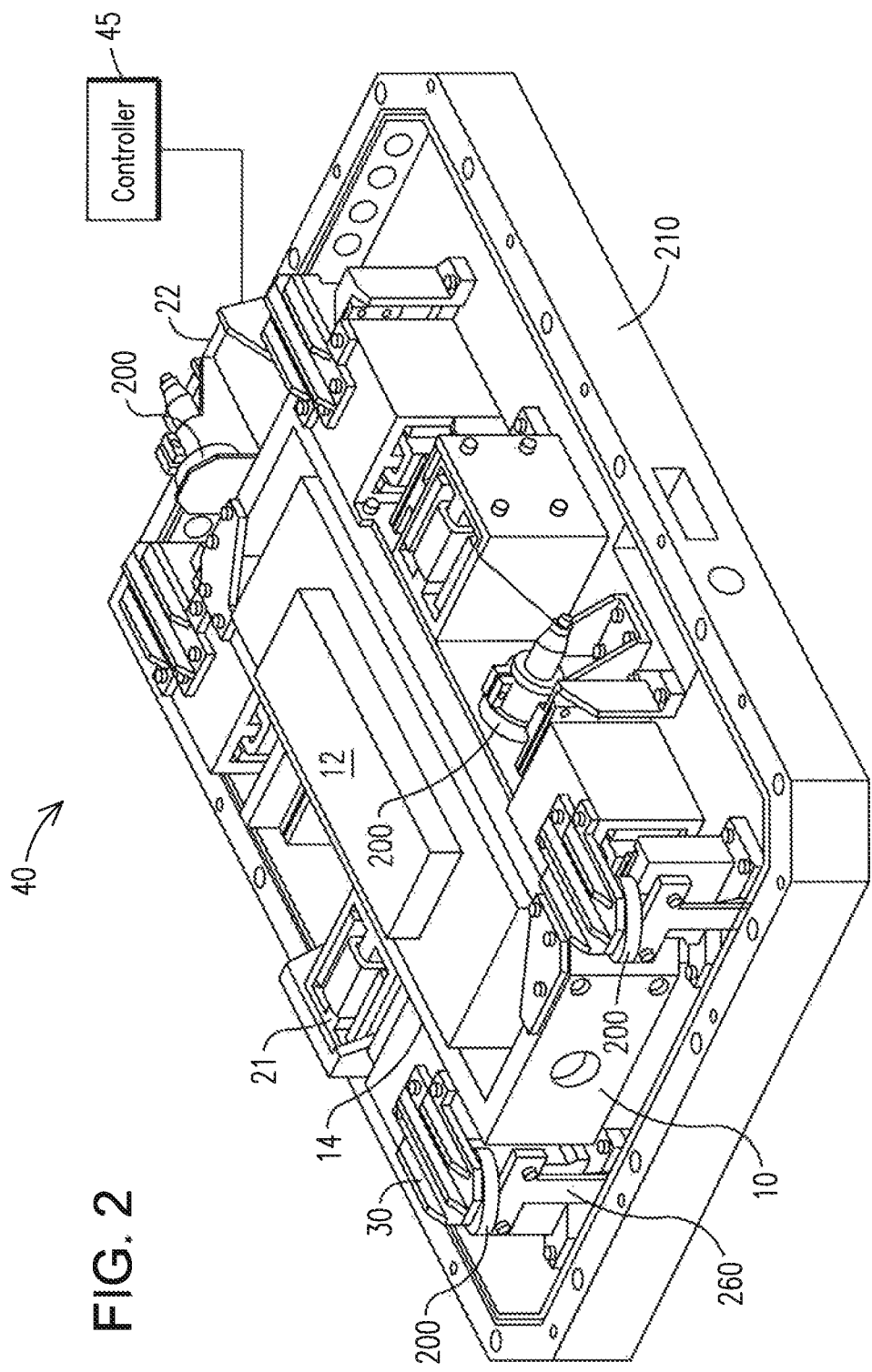
FIG. 2 shows an embodiment of the system.

Embodiments are described herein with reference to the attached figures wherein like reference numerals are used throughout the figures to designate similar or equivalent elements. The figures are not drawn to scale and they are provided merely to illustrate aspects disclosed herein. Several disclosed aspects are described below with reference to non-limiting example applications for illustration. It should be understood that numerous specific details, relationships, and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. The embodiments are not limited by the illustrated ordering of acts or events, as some acts may occur in different orders and/or concurrently with other acts or events. Furthermore, not all illustrated acts or events are required to implement a methodology in accordance with the embodiments.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 4.

FIG. 1 shows an embodiment of an inner translated assembly of a system. A payload 12 is shown on the translated assembly 10. The payload 12 may be a device which must remain as stable or immobile as possible to ensure proper operation of the payload. Several non-limiting examples of the payload may be a laser, such as, but not limited to, a local oscillator laser, scanning electron microscope, atomic force microscope, lithography for integrated chip manufacturing, etc. The payload 12 may be located within a compartment 14 configured to hold the payload 12.

As used herein, the terms "payload" and "compartment" may be used interchangeably. A plurality of field assemblies 16, 17, 18, 19, 20, 21, and 22 are attached to the payload 12, 14. Thus, in a non-limiting example, a compartment 14 is not used and the field assemblies are attached directly to the payload 12. Thus, as used herein the payload may be identified by both or either reference numbers 12 and 14 as the compartment may be provided to house the actual payload wherein levitation of the payload also requires levitation of the compartment.

A first, second, third, and forth field assembly 16, 17, 18, 19 may be part of an actuator 50 configured to control levitation (or lift), pitch, and roll of the payload or compartment. In another embodiment, the actuator may be part of a magnetic levitation subsystem, where the subsystem may comprise a plurality of actuators. A fifth and sixth field assembly 20, 21 may be provided to control lateral movement of the payload or when applied differentially to control yaw. A seventh field assembly 22 may be provided to control longitudinal movement of the payload or compartment. Each of the first, second, third and fourth field assemblies 16, 17, 18, 19 (or vertical linear motors or vertical motors) may have a respective sensor target 30 attached to the respective field assembly. Though the sensor targets 30 are shown as being attached the respective field assemblies, this configuration, namely, placement of the sensor targets, is not provided to be limiting as the sensor targets and field assemblies may comprise other configurations with locations of the sensor targets being at other locations depending on a configuration of a system. As explained further herein, the sensor targets 30 may further assist in controlling the levitation, pitch, and roll of the payload 12, 14. During levitation, the inner translated assembly 10 is levitated.

FIG. 2 shows an embodiment of the system. The inner translated assembly 10 is located within a system 40, such as a magnetic levitation system or subsystem. The system 40 provides for a six degree of freedom magnetic levitation system where nearly a same level of isolation in each degree of freedom or at least any degree roll off, such as, but not limited to a third degree roll off, up to a ninth degree roll off, in each degree of freedom may be realized. As provided for herein, the magnetic levitation system 40 may comprise a control system or subsystem, that comprises a plurality of magnetic actuators 16, 17, 18, 19, 20, 21, 22 and displacement sensors 200 located at various locations around the payload 12, 14 to minimize undesired acceleration of the payload 12, 14 while levitated. Each field assembly 16, 17, 18, 19, 20, 21, 22 is a part of each individual motor assembly 50. As illustrated, field assemblies 16, 17, 18, and 19 are individually a part of larger motor assemblies 50 which provide for a majority of the levitation. The other three motor assemblies 50 which individually includes one of other field assemblies 20, 21, 22 may be provided to ensure elimination of lateral displacement of the payload 12, 14. The control system may also comprise a controller 45 which is explained in further detail below.

In a non-limiting embodiment, the field assemblies may be placed symmetrically about a center of gravity of the payload 12. However, placing symmetrically about a center of gravity is not a requirement as correcting for non-symmetry may be addressed by tuning a decoupling matrix 550, the decoupling matrix is disclosed herein in further detail beginning with FIG. 5. A recognized deficiency with non-symmetry placement is that a load from the payload 12, 14 realized by the field assemblies is no longer equally displaced between the field assemblies when compared to symmetric placement.

The displacement sensors 200 may provide for feedback to the controller 45. In an embodiment the sensors 200 are non-contact sensors, such as, but not limited to, capacitive or inductive. A non-contact sensor may be used to eliminate friction that may be realized by use of a contact-type sensor.

FIG. 3 shows an embodiment of the motor assembly or actuator. The motor assembly 50 is a brushless linear motor assembly capable of vertically lifting the payload 12, 14. For illustration purposes only, the motor assembly will be considered to include the first field assembly 16, however, this designation is not provided to be limiting. The motor assembly 50 may comprise a coil assembly 310 located within the first field assembly 16 with permanent magnets 320 on at least two sides of the coil assembly 310 within the field assembly 16. A coil mount 330 may be provided to position the coil assembly 310 above a base 210 of the system 40. A coil isolator 340 may be provided to enable vibration isolation of the coil assembly 310. The field assembly 16 may be attached to the payload 12, 14. The coil isolator 340 may also separate the coil mount 330 from the field assembly 16 as it provides passive vibration isolation of the coil assembly 310. As a non-limiting example, the coil isolator 340 may be made of a pliable material such as, but not limited to, a rubber material.

Turning back to FIG. 2, a plurality of displacement sensors 200, or position sensors, may be provided. In essence, as illustrated, a plurality of sensors is provided to sense the six degrees of freedom of the payload 12, 14. Locations of the sensors 200 may be symmetrical about the center of gravity of the payload 12, 14, along a center line. As a non-limiting example, at least one individual displacement sensor 200 may be used with an individual motor assembly 50. Thus, as illustrated, depending on a placement of field assemblies and a function of a payload, a plurality of displacement sensors 200 may be dispersed around the payload with each individual sensor in relation to a respective motor assembly, though placement adjacent to the respective motor assembly is not required.

As a further non-limiting example, the first motor assembly 16 may be in communication with a first displacement sensor 200 that is positioned in a vertical arrangement in close enough proximity to the sensor target 30 so that the sensor 200 may determine a relative position of the target 30 with the sensor 200, such as, but not limited to, detecting when the sensor target 30 is too far away or too close to the displacement sensor 200. A similar arrangement of the second, third and fourth motor assemblies 17, 18, 19, at least one respective sensor target 30, and at least one respective displacement sensor 200 is also illustrated. A fifth and sixth displacement sensor 200 may be provided in relation to the lateral motors 50 to control lateral movement and yaw. The payload 12, or compartment 14, may be the sensor target for these displacement sensors 200. A seventh displacement sensor 200 may be provided in relation to the longitudinal motor assembly 50 to control longitudinal movement. A sensor target may also be a part of the payload 12 or compartment 14.

Figure 4:
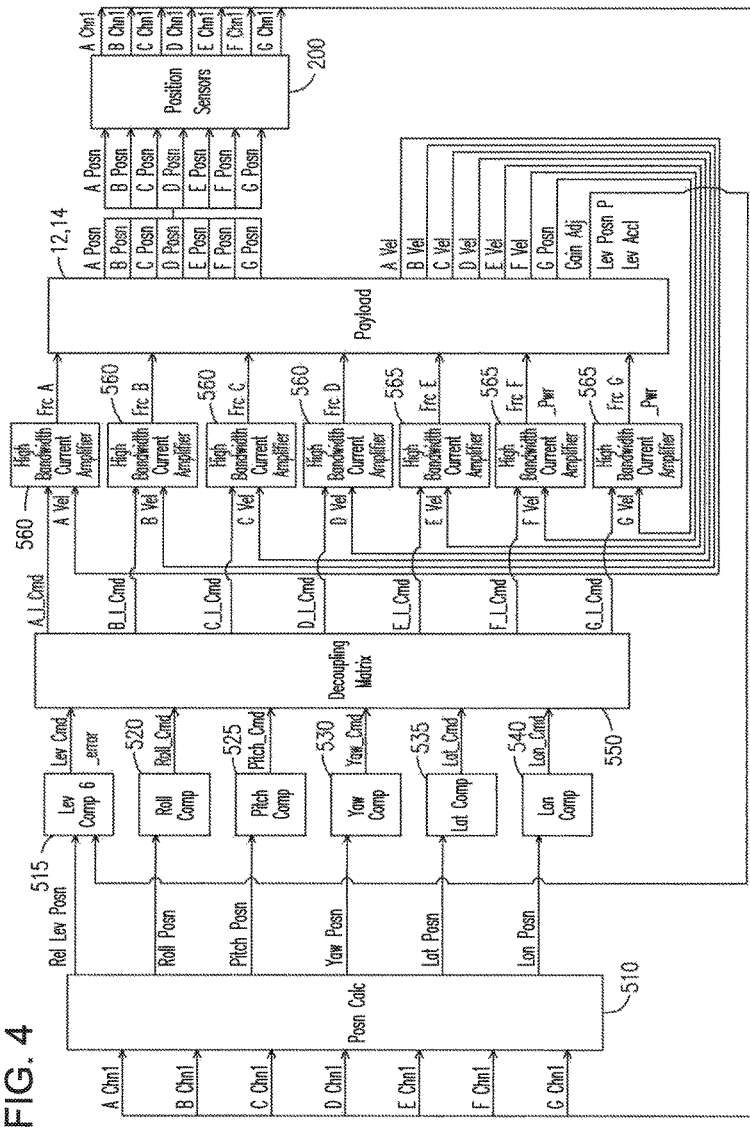
FIG. 4 shows an embodiment of a top level control block diagram representative of the system.

FIG. 4 shows an embodiment of a top level control block diagram representative of the system. The embodiments of FIGS. 4-9 may be part of at least one controller 45. As illustrated, a position calculator 510 may determine position information, namely, levitation, roll, pitch, yaw, lateral, and longitudinal of the payload 12, 14. Each respective position is communicated to one of six compensation blocks 515, 520, 525, 530, 535, 540, each individually representing a particular degree of freedom. More specifically, each compensation block may control a different movement, namely, levitation, roll, pitch, yaw, lateral, and longitudinal of the payload. Commands are then passed to a decoupling matrix 550. The decoupling matrix 550 may provide for independent and simultaneous control of the payload in the six degrees of freedom. The decoupling matrix 550 may be configured to determine how much force should take place with respect to the first, second, third and fourth actuator to independently and simultaneously control the levitation of height, roll, and pitch of the payload 12. The lateral control and longitudinal controller functions similarly for the lateral actuators (moving laterally or yaw) and the longitudinal actuators and also determined.

Figure 5:
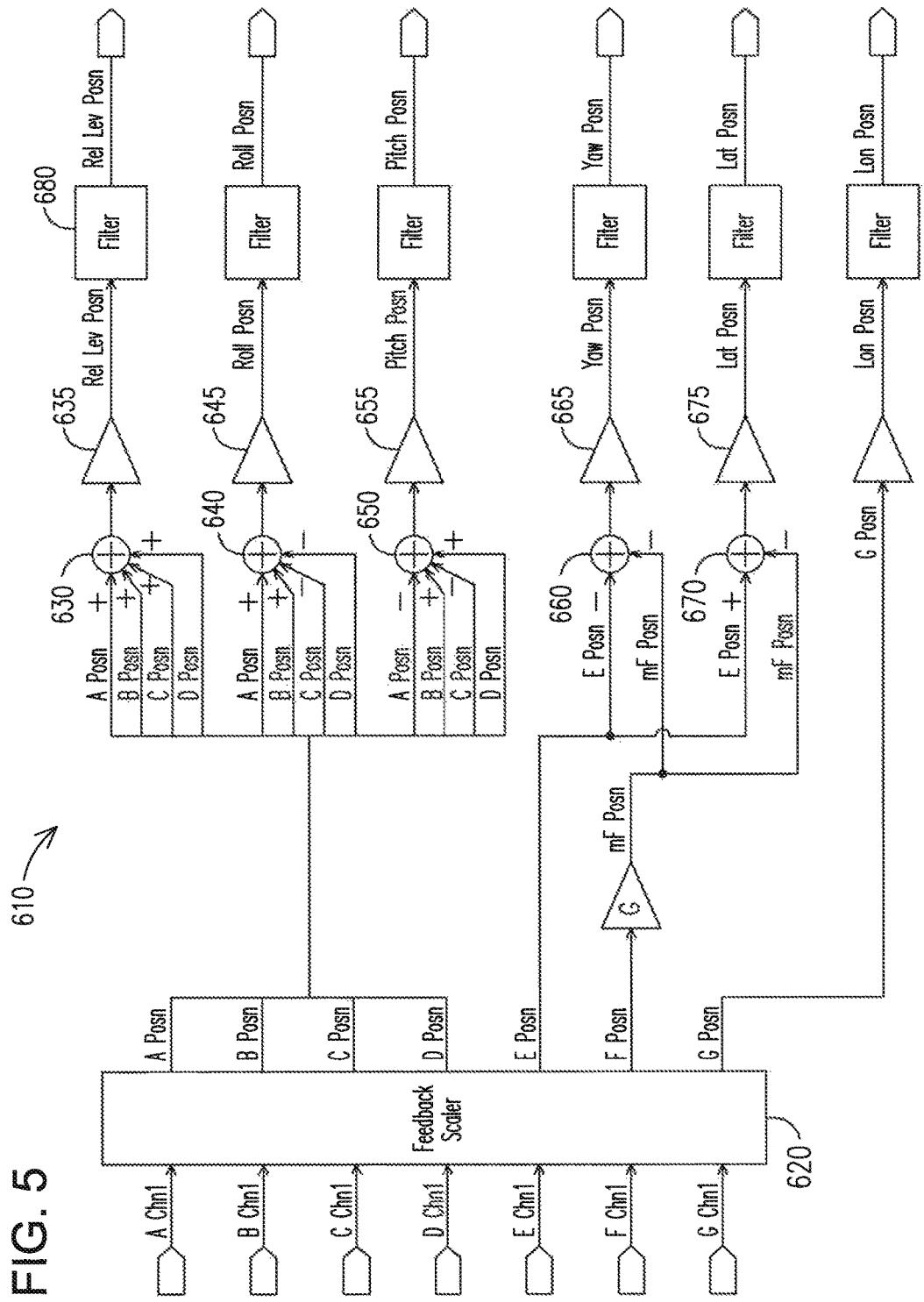
FIG. 5 shows an embodiment of a position calculator illustrated in FIG. 4.

FIG. 5 shows an embodiment of a position calculator illustrated in FIG. 4. A six degree of freedom position calculator 610 is shown. A feedback scaler 620 may be provided to scale the feedback from the sensors 200. Adding positions A, B, C, D from the Feedback Scaler, at 630, may provide for the levitation height. The levitation height may then be multiplied, at 635, by a quarter (¼ or 0.25) (since four position sensors provide for levitation height) to determine the relative levitation position. The roll position, at 640, may be determined by adding positions A and B, subtracting positions C and D and then multiplying, at 645, by a fraction relative to the physical layout, or characteristic, of the components of the actuators of the system used for roll. As a non-limiting example, the roll position may be determined based on a physical layout, or characteristic of components, such as, but not limited to, an actuator. A non-limiting physical layout, where a value is determined, may be a moment arm which is realized from a center of gravity to an actuator which may then be divided by four (since there are four actuators sued for roll). The pitch position may be determined by adding, at 650, position B and D and subtracting position A and C, and then multiplying, at 655, by a number determined by the physical layout of the components of the actuators of the system used for pitch. Yaw may be determined by subtracting, at 660, the fifth position from the seventh position then multiplied, at 665, by a factor based on physical layout of components of the actuators of the system 40 used for yaw divided by 2 (since there are only two actuators used for yaw) and a fraction relative to the physical layout of the component of the actuators of the system used for yaw. With respect to lateral position, the sixth position is subtracted, at 670, from the fifth position and then multiplied, at 675, but a half (½ or 0.50). Each position may be provided to a filter 680. In a non-limiting example, the filter 680 may be a second order filter which has a damping coefficient and operates at a particular frequency, which may be established based on characteristics, such as, but not limited to, size and weight, of the object being levitated, or a frequency related to a platform, such as, but not limited to, an air vehicle, a watercraft, a land vehicle, etc., upon which the system 40 is located. The resulting signals may then be used to independently provide for feedback for compensation for each motion/degree of freedom.

Figure 6:
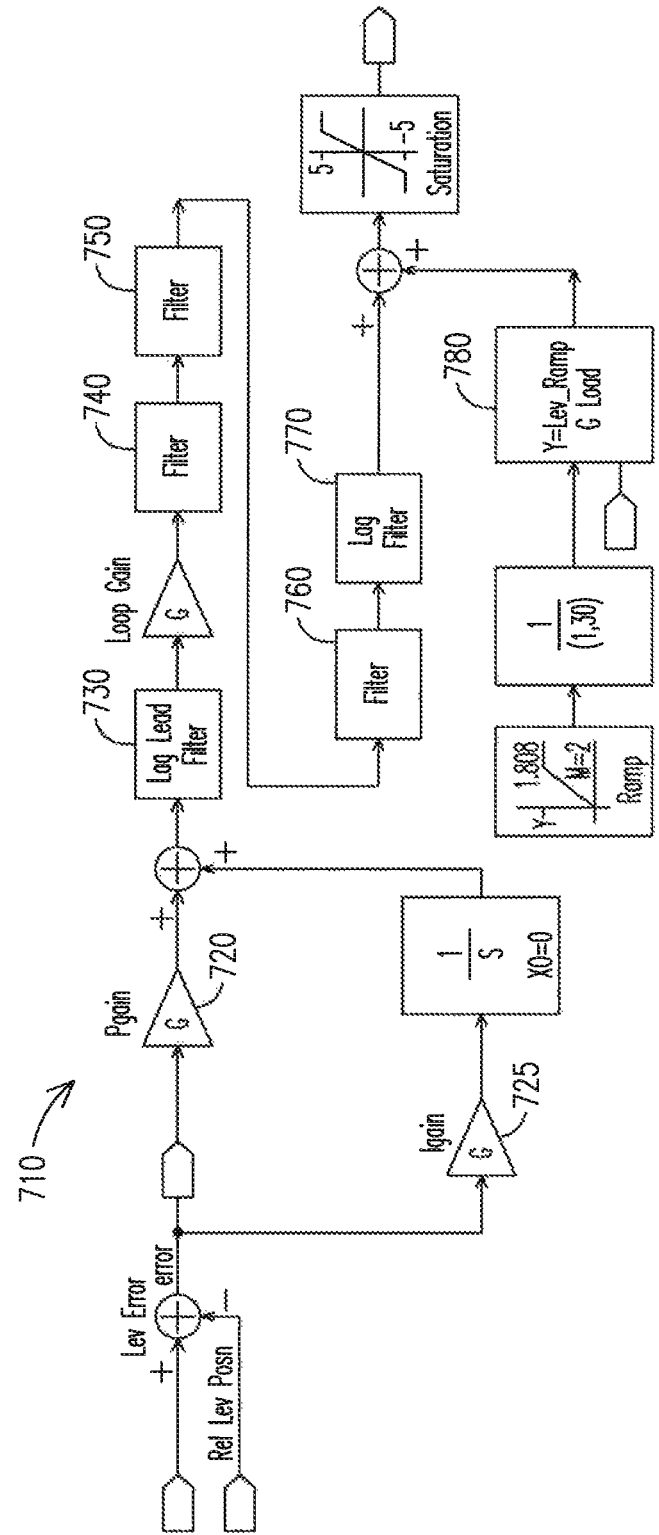
FIG. 6 shows an embodiment of a levitation compensation block illustrated in FIG. 4.

FIG. 6 shows an embodiment of a levitation compensation block illustrated in FIG. 4. The levitation compensation block 710 may include a proportional gain factor 720 combined with an integral gain factor 725 passed through a lead/lag filter 730 for compensation. The other filters provided result in a high order roll off, at least a third order roll off up to a ninth order roll off. As illustrated, since the configuration is a position loop, second order roll off exists within the physics (or physical make up or physical characteristics) of the levitated payload or plant, wherein "plant" may include the mechanical components which are levitated. Each additional filter 740, 750, 760 adds two more orders of roll off, bringing the system to an eight order roll off. Then, a single pole filter 770, such as, but not limited to, a lag filter, provides for a ninth order roll off. The first three filers 740, 750, 760 may be low pass filters, such as, but not limited to, second order low pass filters. The filters illustrated with respect to FIG. 6 and the other figures may be analog filters. The frequencies of the filters disclosed herein may be in radians/second. Each filter herein may also comprise a dampening coefficient. A feed forward accelerator 780 with an external input 790 may be provided when operation conditions of a device which the system is being used on is known so as to provide for rapid levitation. As a non-limiting example, if the system is used on an aircraft, the external input 790 to the feed forward accelerator 780 may be from the internal navigation system of the aircraft. Thus, levitation three may be adjusted in response to the aircraft's movements, including if the aircraft is exceeding a gravitational force in excess of 1 g so as to inhibit the payload from bottoming out within the base of the system if the feed forward accelerator 780 was not present.

Figure 7:
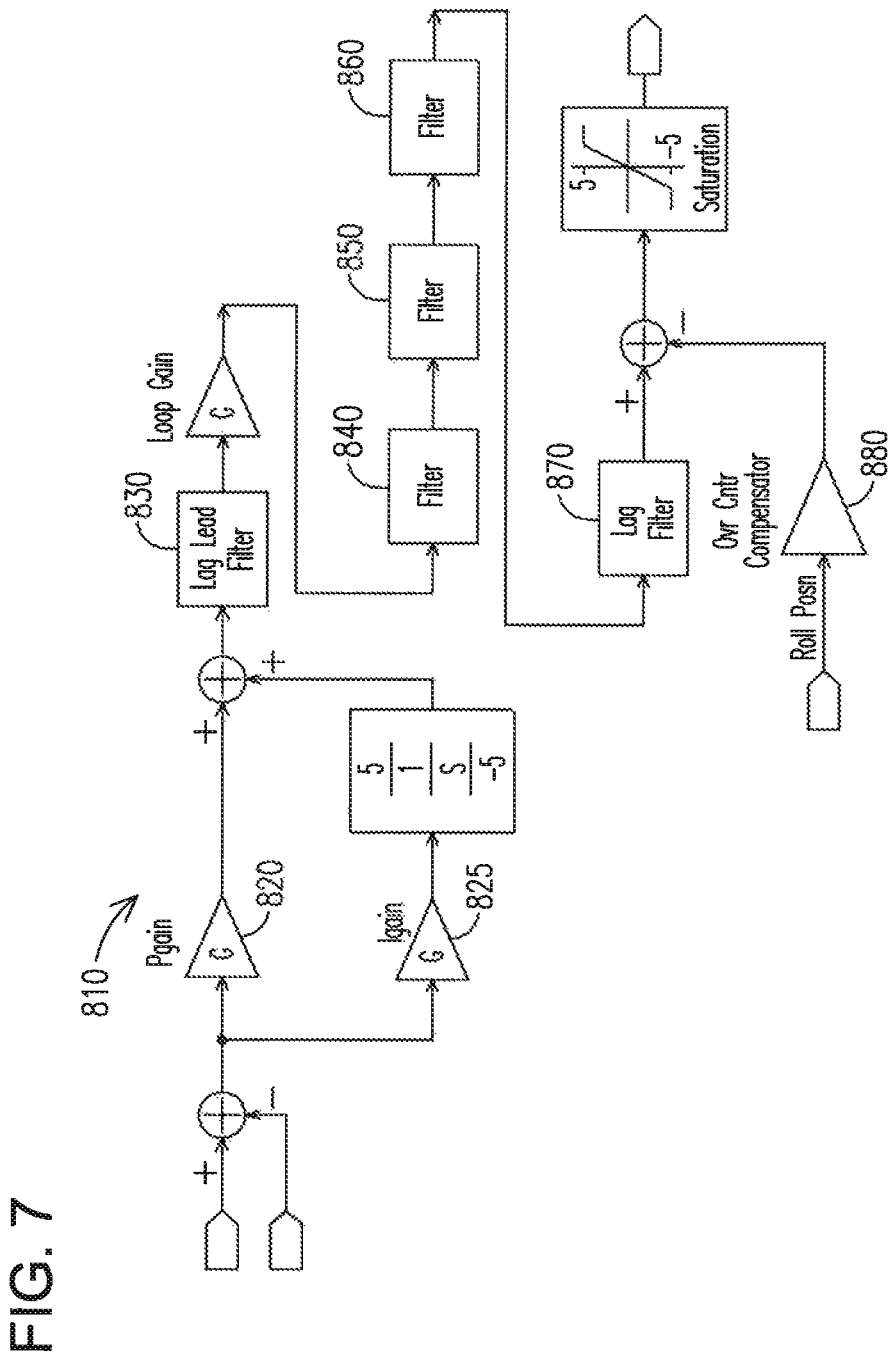
FIG. 7 shows an embodiment of a roll compensation block illustrated in FIG. 4.

FIG. 7 shows an embodiment of a roll compensation block illustrated in FIG. 4. Like the levitation compensation block 710, within the roll compensation block 810 proportional gain 820 and integral gain 825 may be added and then may be provided to a lead/lag filter 830 for compensation. Three low pass filters 840, 850, 860 may then be followed by a lag filter 870 which collectively, in this configuration, provides for a ninth order roll off. The magnetic fields created by the linear actuators 50 during roll may not be uniform, which provides for varied force depending on the roll position, causing the payload 12, 14 to behave like an over-centered spring where roll compensation was determinative by the magnetic field at a particular location. A compensator feedback 880 may be provided to cancel the overcompensation due to the magnetic fields of the linear actuators 50.

Figure 8:
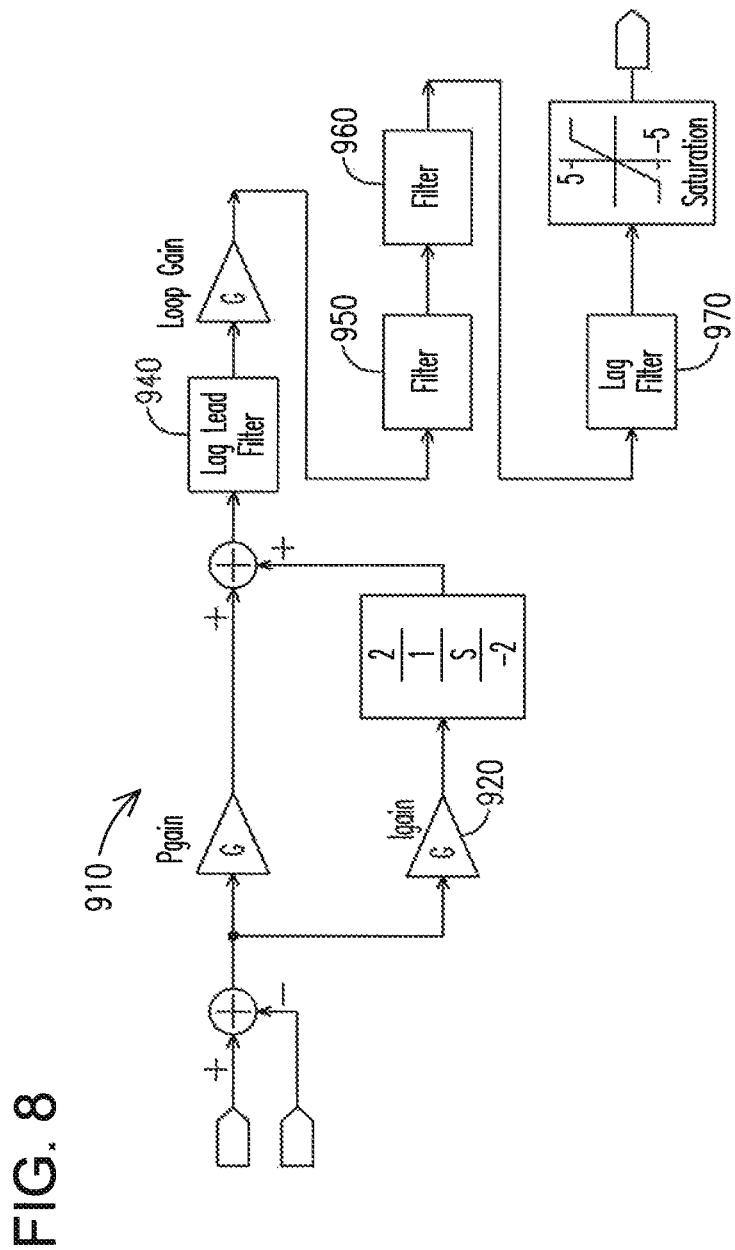
FIG. 8 shows an embodiment of a pitch, lateral, yaw and longitudinal compensation blocks illustrated in FIG. 4.

FIG. 8 shows an embodiment of a pitch, lateral, yaw and longitudinal compensation blocks illustrated in FIG. 4. This compensation block 910 also may combine an integral gain 920 with a proportional gain 930 which may then be fed into a lead/lag filter 940. Two low pass filters 950, 960 and a lag filter 970 may be provided to produce a seventh order roll off.

Figure 9:
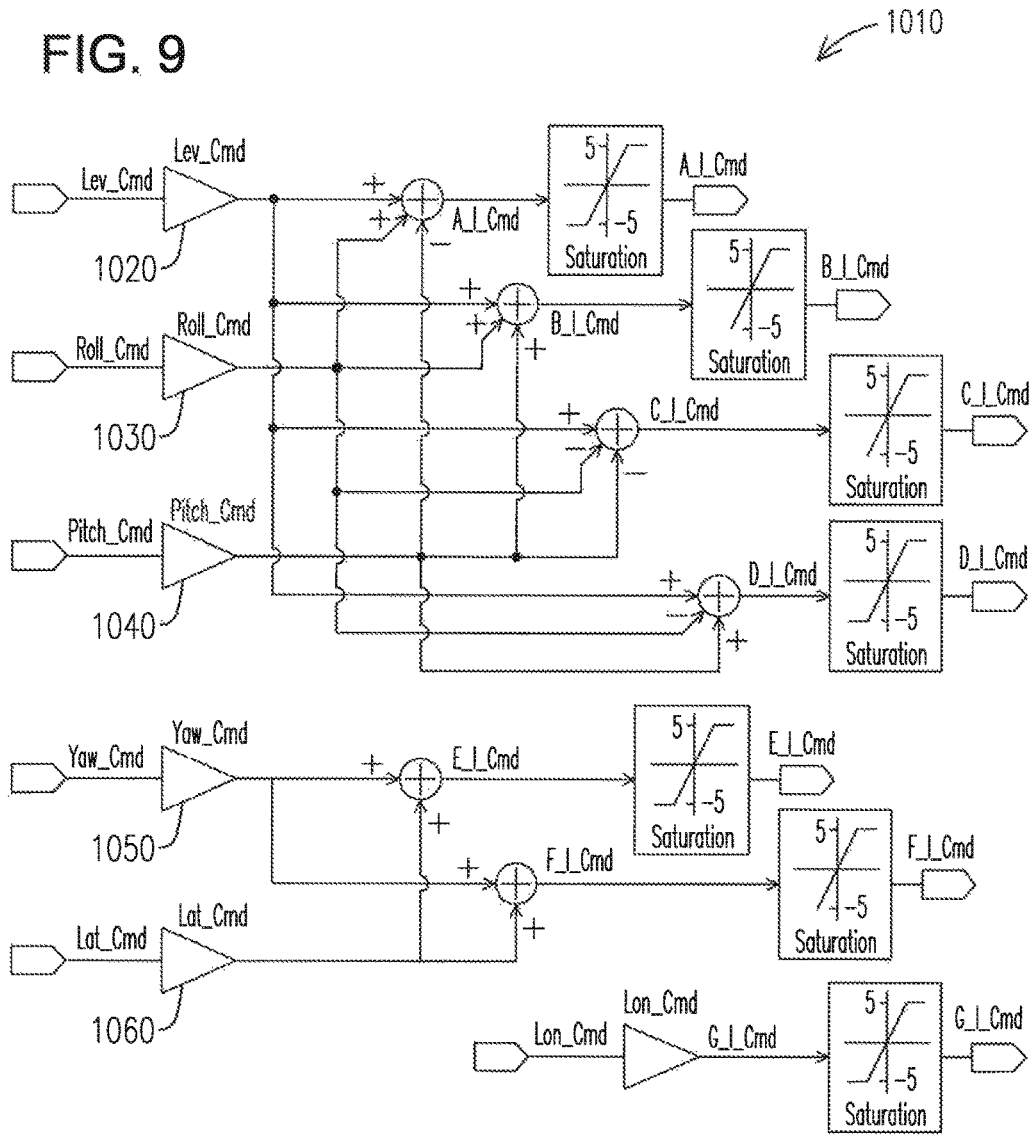
FIG. 9 shows the decoupling matrix illustrated FIG. 4.

FIG. 9 shows the decoupling matrix illustrated in FIG. 4. The decoupling matrix 1010 may enable simultaneous and independent control of the six degrees of freedom. Levitation command 1020 may provide a positive signal to input to A, B, C, D. Each command may be viewed as individual motor current commands which ultimately result in a force command. Roll command 1030 may provide a positive input for A and B and negative input for C and D. Pitch command 1040 may provide negative input to A and C and positive input to B and D. Yaw command 1050 may provide a positive input to E and a negative input to F. Lateral command 1060 may provide a positive input to both E and F. As shown A, B, C, D drives provide control of levitation, roll and pitch. The E and F drives provide control of lateral position and yaw. The G drive provides control of longitudinal current. These signals provide for six degrees of freedom motor currents.

Turning back to FIG. 4, these commands are provided to a respective high bandwidth current amplifier 560, or current control loop. As a non-limiting example, A is provided to a levitation/roll/pitch high bandwidth current amplifier 560. A resulting force is then supplied to the payload or compartment 12, 14 which is levitated. Payload position is then provided to the sensors 200. As further illustrated, another type of loop similar to the first loop 560 is a yaw/lateral/longitudinal loop 565 as a different style of motor may be utilized.

Figure 10:
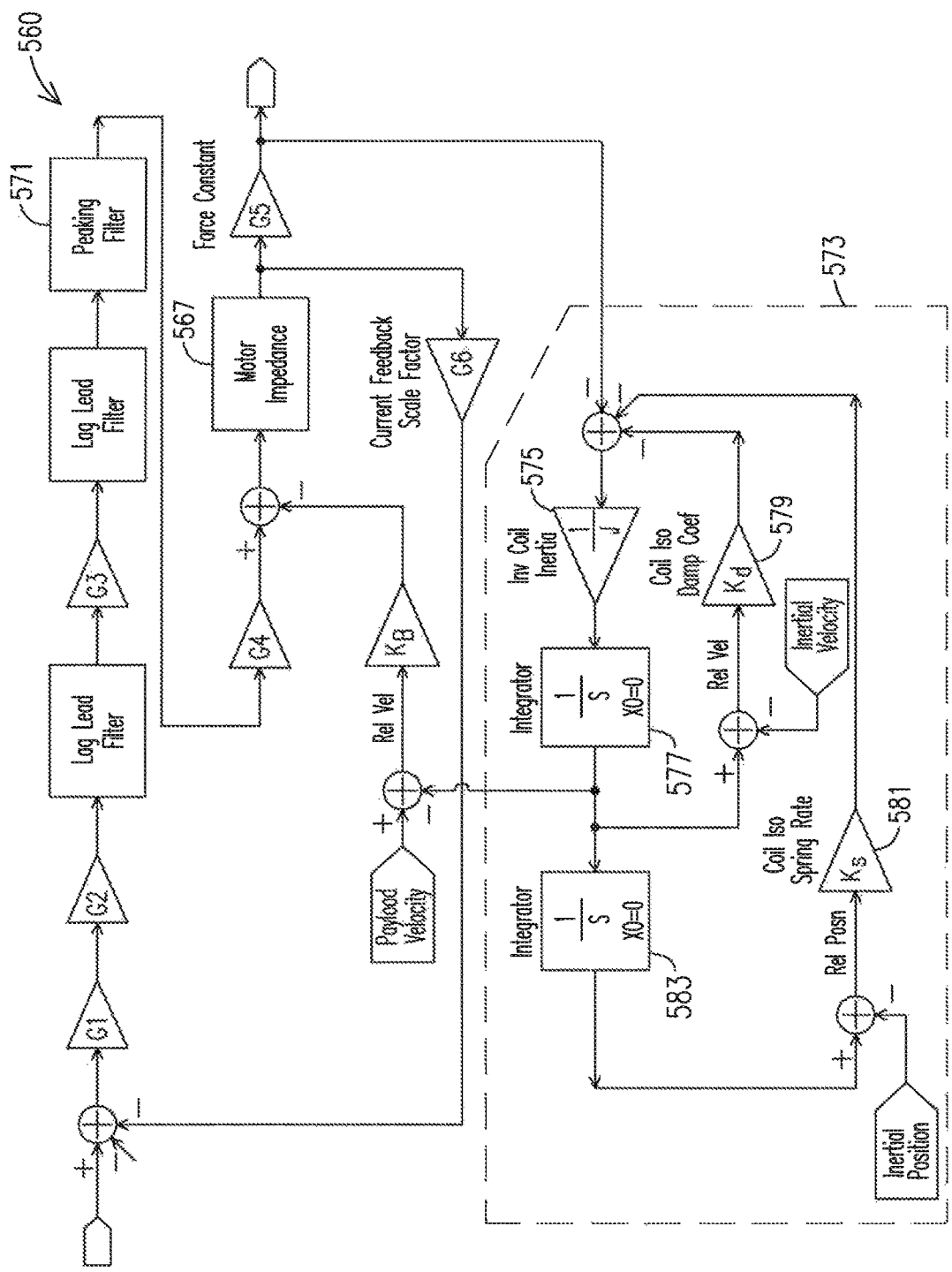
FIG. 10 shows an embodiment of a current loop of a motor current amplifier.

FIG. 10 shows an embodiment of a current loop of a motor current amplifier. As illustrated, the current control loop 560 may provide for a high gain/high bandwidth current loop. The current control loop 560 may provide for a gain bandwidth in excess of 100,000,000, such as, but not limited to, as a non-limiting example 300,000,000. As a non-limiting example, such a high gain bandwidth may be needed due to a dominant coupling mechanism during levitation from vibration at the base through the coil assembly to the levitated payload due to the back electromagnetic field ("EMF") produced by the actuator or motor. The current control loop 560 is provided to cancel out the effects of the back EMF of the actuators, or motors. This may be done with high order filtering as illustrated. As illustrated, a gain component G1 is provided. Another gain component G2 and filter 568, such as, but not limited to, a lag/lead filter are included. Another gain component G3 and another filter 569 may also be included. A combination of a gain component and filter may be integrated within an operational amplifier. Also included is a peaking filter 571 which may be specific to passive isolation of the coil assembly 330. Motor impedance 567 is also illustrated. The loop 560 may include a gain component G4 that drives into the motor impedance component 567. Another input to the motor impedance 567 is the payload velocity that couples through a back EMF constant, $K_B$. Output from the motor impedance component 567 may be provided to one of either another gain components G5, G6.

A coil dynamic passive isolator 573, or simply a passive isolator, may also be included. Coil velocity from the passive isolator 573 couples to the motor impedance 567 through the back EMF constant, $K_B$. The passive isolator 573 may comprise an inverse coil inertia convertor 575, and a first integrator 577, and a coil isolation damper 579, with a mechanical damping coefficient $K_d$. An inertial position is supplied which passes through a coil isolator 581, which has a spring rate constant $K_S$, and is provided to the inverse coil inertia convertor 575. A second integrator 583 may also be provided which may be provided between the first integrator 577 and the coil isolation damper coefficient 579. Inertial velocity is also provided to the coil isolation damper coefficient 579.

Additionally, the current control loop 560 may provide for sufficient high gain bandwidth to provide for vibration isolation sufficient to eliminate vibrational effects resulting from movement of the platform (not shown) that the system 40 may be used with. The current control loop 560 has high order filtering occurring within the current control loop 560. Such filters may include lag/lead filters, saturation filters, and motor windings that combine with other inputs, such as, but not limited to, base velocity and base position, to provide for the current control loop 560 having high gain/high bandwidth.

Figure 11:
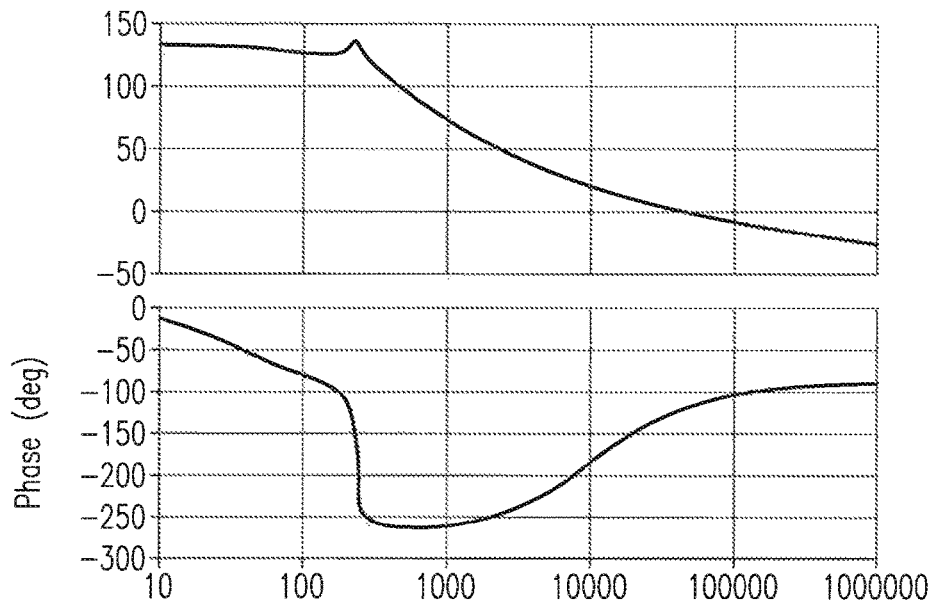
FIG. 11 shows an embodiment of a transfer function of the current loop illustrated in FIG. 11.

FIG. 11 shows an open loop transfer function embodiment of the current loop illustrated in FIG. 11. The frequency of transfer function is on a logarithmic scale. The shown embodiment of the transfer function is non-limiting as this transfer function may vary based on a specific design of the current control loop 560. Thus, as illustrated, gain, measured in decibels and phase, measured in degrees, is plotted versus frequency. A gain of 3,000,000 at 100 hertz is realized.

Figure 12A:
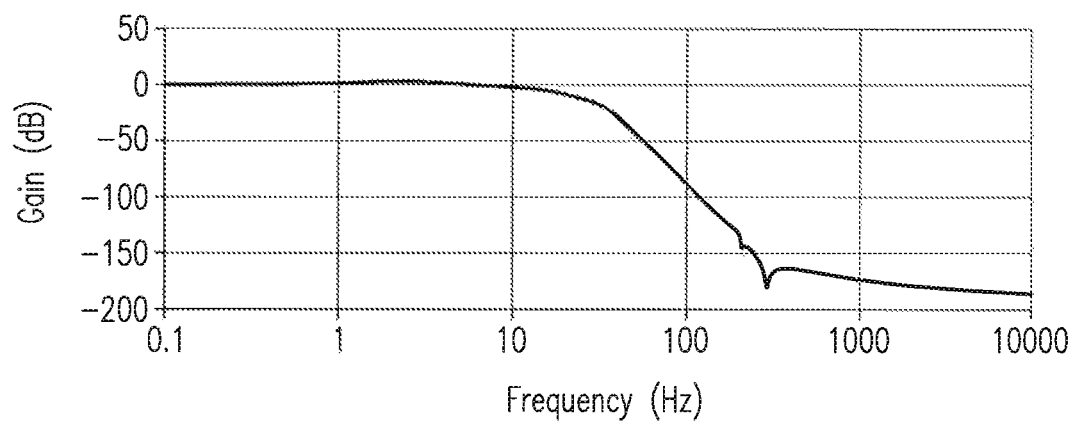
FIG. 12A shows a transfer function embodiment of a levitated payload with the coil.
Figure 12B:
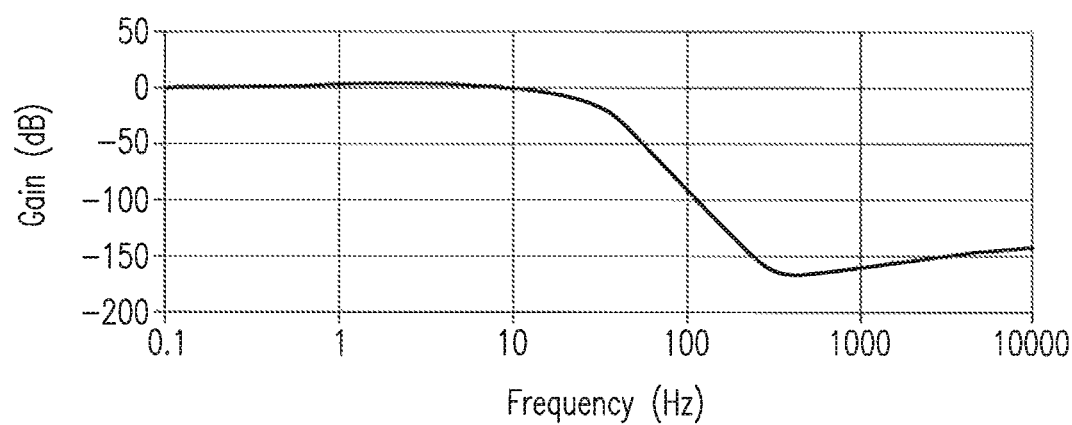
FIG. 12B shows a transfer function embodiment of the levitated payload without the coil isolator.

FIG. 12A shows a transfer function embodiment of a levitated payload with the coil isolator 560 illustrated in FIG. 10 and FIG. 12B shows a transfer function embodiment of the levitated payload without the coil isolator. The frequency of the transfer function is on a logarithmic scale. As shown, in FIG. 12A, with the coil isolator 560, the attenuation continues to increase as the frequency increases. Whereas with the coil isolator 560, as shown in FIG. 12A, the attenuation will reach a maximum and then start to decrease as the frequency increases.

Figure 13:
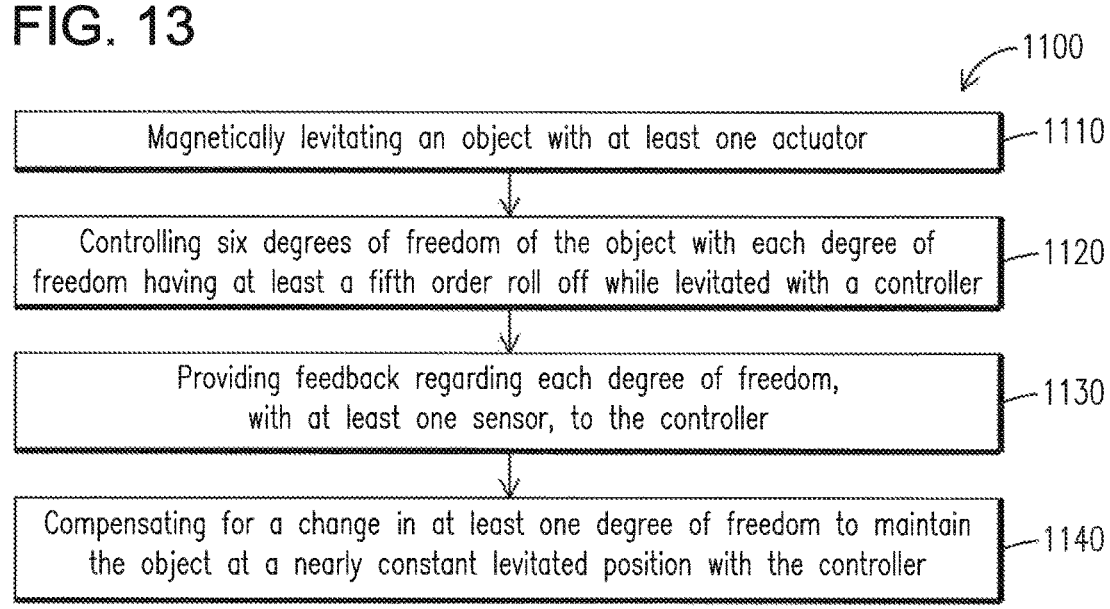
FIG. 13 shows flowchart of an embodiment of a method.

FIG. 13 shows flowchart of an embodiment of a method. The method 1100 comprises magnetically levitating an object with at least one actuator, at 1110. The method 1100 also comprises controlling six degrees of freedom of the object with each degree of freedom having at least a third order roll off while levitated with a controller, at 1120.

The method 1100 may further comprise providing feedback regarding each degree of freedom, with at least one sensor, to the controller, at 1130. The method 1100 may further comprise compensating for a change in at least one degree of freedom to maintain the object at a nearly constant levitated position with the controller, at 1140. Controlling the six degrees of freedom, at 1120, may further comprise controlling each degree of freedom of the six degrees of freedom independently of the other degrees of freedom and simultaneously with the other degrees of freedom. Though the steps of the method 1100 are shown in a particular order, this order is not limiting as the method may be performed in any order.

Thus, low frequency passive isolation is realized in six degrees of freedom, but with critical damping in all six axes. Furthermore, instead of realizing only a second order roll off, ninth order roll off may be realized. Thus, when tuned to a particular frequency, such as, but not limited to, a 4 hertz bandwidth a significant amount of sway space due to critical damping is not required, even if the system is operating in a high gravitational environment, such as, but not limited to, a three-G environment.

Though the controller is disclosed with the use of analog filters other embodiments are possible. Persons skilled in the art will recognize that an apparatus, such as a data processing system, including a CPU, memory, I/O, program storage, a connecting bus, and other appropriate components, could be programmed or otherwise designed to facilitate the practice of embodiments of function of the controller. Such a system would include appropriate program means for execution. Also, an article of manufacture, such as a prerecorded disk, computer readable media, or other similar computer program product, for use with a data processing system, could include a storage medium and program means recorded thereon for directing the data processing system to facilitate the practice of the method.

Embodiments of the controller may also be described in the general context of computer-executable instructions, such as program modules, being executed by any device such as, but not limited to, a computer, designed to accept data, perform prescribed mathematical and/or logical operations usually at high speed, where results of such operations may or may not be displayed. Generally, program modules include routines, programs, objects, components, data structures, etc., that perform particular tasks or implement particular abstract data types. In an embodiment, the software programs that underlie embodiments can be coded in different programming languages for use with different devices, or platforms. It will be appreciated, however, that the principles that underlie the embodiments can be implemented with other types of computer software technologies as well.

Moreover, those skilled in the art will appreciate that the embodiments may be practiced with other computer system configurations, multiprocessor systems, microprocessor-based or programmable consumer electronics, minicomputers, mainframe computers, and the like. Embodiments may also be practiced in distributed computing environments where tasks are performed by processing devices located at different locations that are linked through at least one communications network. In a distributed computing environment, program modules may be located in both local and remote computer storage media including memory storage devices.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising." Moreover, unless specifically stated, any use of the terms first, second, etc., does not denote any order or importance, but rather the terms first, second, etc., are used to distinguish one element from another.

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While various disclosed embodiments have been described above, it should be understood that they have been presented by way of example only, and not limitation. Numerous changes, omissions and/or additions to the subject matter disclosed herein can be made in accordance with the embodiments disclosed herein without departing from the spirit or scope of the embodiments. Also, equivalents may be substituted for elements thereof without departing from the spirit and scope of the embodiments. In addition, while a particular feature may have been disclosed with respect to only one of several implementations, such feature may be combined with one or more other features of the other implementations as may be desired and advantageous for any given or particular application. Furthermore, many modifications may be made to adapt a particular situation or material to the teachings of the embodiments without departing from the scope thereof.

Therefore, the breadth and scope of the subject matter provided herein should not be limited by any of the above explicitly described embodiments. Rather, the scope of the embodiments should be defined in accordance with the following claims and their equivalents.

We claim:

1. A magnetic levitation system comprising a control subsystem comprising configured to control six degrees of freedom of a levitated object wherein each degree of freedom has at least a fifth order roll off, wherein the control subsystem comprises a plurality of actuators located around the object.

2. The system as set forth in claim 1, wherein at least one of the plurality of actuators comprises a coil isolator.

3. The system as set forth in claim 1, wherein the at least fifth order roll off is up to a ninth order roll off for at least one degree of freedom of the six degrees of freedom.

4. The system as set forth in claim 1, wherein the control subsystem further comprises a plurality of sensors with at least one respective sensor in relationship with at least one actuator of the plurality of actuators.

5. The system as set forth in claim 4, wherein each one of the plurality of sensors is configured to provide feedback regarding at least one respective degree of freedom of the six degrees of freedom.

6. The system as set forth in claim 1, wherein control of each individual degree of freedom of the six degrees of freedom is accomplished independent of any other degrees of freedom of the six degrees of freedom and simultaneously with the other degrees of freedom of the six degrees of freedom.

7. The system as set forth in claim 1, wherein the control subsystem comprises a high gain/high bandwidth current loop configured to eliminate vibration coupling with back electromagnetic field experienced during levitation.

8. A system, comprising:
a magnetic levitation subsystem;
an assembly configured to levitate using the magnetic levitation in six degrees of freedom;
at least one sensor configured to determine displacement of the assembly during levitation in each degree of freedom; and
a controller configured to stabilize the assembly to at least a third order roll off for each degree of freedom.

9. The system as set forth in claim 8, wherein the at least third order roll off is up to a ninth order roll off for at least one degree of freedom of the six degrees of freedom.

10. The system as set forth in claim 8, wherein the assembly further comprises at least one motor assembly configured to produce force to magnetically levitate the assembly.

11. The system as set forth in claim 8, wherein the assembly further comprises at least one sensor target positioned with respect to the at least one sensor to be used by the at least one sensor to provide feedback regarding at position in each degree of freedom of the six degrees of freedom.

12. The system as set forth in claim 8, wherein the controller independently and simultaneously controls the six degrees of freedom of the assembly.

13. The system as set forth in claim 9, wherein the controller comprises a plurality of compensators having a plurality of filters configured to provide for at least a ninth order roll off for each degree of freedom.

14. The system as set forth in claim 8, wherein the controller comprises a six degree of freedom position calculator to establish a position feedback factor for each degree of freedom.

15. The system as set forth in claim 8, wherein the position calculator comprises at least one filter that is configured relative to a physical characteristic of the magnetic levitation subsystem.

16. The system as set forth in claim 8, wherein the controller comprises a high gain/high bandwidth current loop configured to eliminate vibration experienced during levitation.

17. The system as set forth in claim 8, wherein the magnetic levitation subsystem comprises at least one actuator that further comprises a coil isolator.

18. A method, comprising:
   magnetically levitating an object with at least one actuator; and
   controlling six degrees of freedom, of the object with each degree of freedom having at least a fifth order roll off while levitated with a controller, wherein the controller comprises a plurality of actuators located around the object.

19. The method as set forth in claim 18, further comprising providing feedback regarding each degree of freedom, with at least one sensor, to the controller.

20. The method as set forth in claim 18, further comprising compensating for a change in at least one degree of freedom to maintain the object at a nearly constant levitated position with the controller.

21. The method as set forth in claim 18, wherein controlling the six degrees of freedom further comprises controlling each individual degree of freedom of the six degrees of freedom independent of the other degrees of freedom of the six degrees of freedom and simultaneously with the other degrees of freedom of the six degrees of freedom.

* * * * *